(12) United States Patent
Clube et al.

(10) Patent No.: US 11,422,471 B2
(45) Date of Patent: Aug. 23, 2022

(54) METHODS AND SYSTEMS FOR PRINTING LARGE PERIODIC PATTERNS BY OVERLAPPING EXPOSURE FIELDS

(71) Applicant: EULITHA A.G., Kirchdorf (CH)

(72) Inventors: Francis Clube, Windisch (CH); Harun Solak, Untersiggenthal (CH)

(73) Assignee: Eulitha AG, Kirchdorf (CH)

( * ) Notice: Subject to any disclaimer, the term of this patent is extended or adjusted under 35 U.S.C. 154(b) by 0 days.

(21) Appl. No.: 17/048,382

(22) PCT Filed: Apr. 18, 2019

(86) PCT No.: PCT/IB2019/053239
§ 371 (c)(1),
(2) Date: Oct. 16, 2020

(87) PCT Pub. No.: WO2019/202551
PCT Pub. Date: Oct. 24, 2019

(65) Prior Publication Data
US 2021/0103222 A1 Apr. 8, 2021

Related U.S. Application Data

(60) Provisional application No. 62/659,731, filed on Apr. 19, 2018.

(51) Int. Cl.
*G03F 7/20* (2006.01)
(52) U.S. Cl.
CPC ...... *G03F 7/70408* (2013.01); *G03F 7/70058* (2013.01)

(58) Field of Classification Search
CPC .............. G03F 7/70058; G03F 7/70408
See application file for complete search history.

(56) References Cited

U.S. PATENT DOCUMENTS

| 8,368,871 B2 | 2/2013 | Solak et al. |
| 8,524,443 B2 | 9/2013 | Clube et al. |
| 8,525,973 B2 | 9/2013 | Solak et al. |
| 8,841,046 B2 | 9/2014 | Solak |

(Continued)

FOREIGN PATENT DOCUMENTS

| WO | 2013029985 A2 | 3/2013 |
| WO | 2017103817 A1 | 6/2017 |

*Primary Examiner* — Peter B Kim
(74) *Attorney, Agent, or Firm* — Laurence A. Greenberg; Werner H. Stemer; Ralph E. Locher

(57) ABSTRACT

A method for printing a periodic pattern of linear features into a photosensitive layer which includes providing a mask bearing a pattern of linear features, arranging the substrate parallel to the mask, generating an elongated beam for illuminating the mask with a range of angles of incidence in a plane parallel to the linear features and with a uniform power per incremental distance along the length of the beam except at its ends where the power per incremental distance falls to zero according to first and second profiles over a fall-off distance, and scanning the beam in first and second sub-exposures to print first and second parts of the desired pattern such that the first and second parts overlap by the fall-off distance. The first and second profiles are selected so that their summation across the fall-off distance produces a uniform power per incremental distance.

14 Claims, 10 Drawing Sheets

(56) References Cited

U.S. PATENT DOCUMENTS

| | | | |
|---|---|---|---|
| 8,904,316 B2 | 12/2014 | Solak et al. | |
| 9,007,566 B2 | 4/2015 | Clube et al. | |
| 9,036,133 B2 | 5/2015 | Solak et al. | |
| 9,182,672 B2 | 11/2015 | Solak et al. | |
| 9,280,056 B2 | 3/2016 | Clube et al. | |
| 9,658,535 B2 | 5/2017 | Clube et al. | |
| 2003/0138742 A1* | 7/2003 | Irie | G03F 7/70066 430/396 |
| 2008/0311531 A1* | 12/2008 | Wang | G03F 7/70408 430/394 |
| 2012/0009525 A1* | 1/2012 | Clube | G03F 7/70408 430/322 |
| 2014/0307242 A1 | 10/2014 | Solak et al. | |

* cited by examiner

METHODS AND SYSTEMS FOR PRINTING LARGE PERIODIC PATTERNS BY OVERLAPPING EXPOSURE FIELDS

BACKGROUND OF THE INVENTION

Field of the Invention

U.S. Pat. No. 8,841,046 discloses two related photolithographic methods based on the Talbot effect for printing periodic arrays of high-resolution features with high-uniformity onto non-flat substrates. In the first of these, a periodic pattern in a mask is illuminated by a beam of collimated light beam from a source having a broad spectral bandwidth, and the wafer is positioned beyond a certain distance from the mask at which the image becomes "stationary", that is, its intensity distribution becomes substantially invariant to further increase in distance. The distance beyond which the image is stationary has been shown (Solak et al. "Achromatic spatial frequency multiplication: A method for production of nanometer-scale periodic features", J. Vac. Sci. Technol. B23(6), 2005) to be related to the full width at half maximum bandwidth, $\Delta\lambda$, by $$d \approx \frac{k\Lambda^2}{\Delta\lambda}$$

where $\Lambda$ is the period of the pattern and $k$ is a constant.

In the second method, the periodic pattern in the mask is instead illuminated by a collimated beam of monochromatic light and the separation between the substrate and mask is varied during exposure by a distance corresponding to an integer multiple of the period of the periodic variation of the intensity distribution in the direction orthogonal to the mask, in other words, by an integer multiple of the Talbot distance. This prints an average of the transverse intensity distributions between the Talbot planes into the photosensitive layer on the substrate, and because the average is independent of the initial separation of the mask and substrate, the printed pattern has a practically unlimited depth of focus. The disclosure further teaches that the separation may be varied during exposure either continuously over this range or in a discrete way by exposing the substrate at multiple positions.

These two methods are now commonly referred to as "Achromatic Talbot lithography" (ATL) and "Displacement Talbot lithography" (DTL) respectively.

For certain types of periodic array, the patterns printed using ATL or DTL are "spatial frequency multiplied" with respect to the pattern in the mask. For example, in the case of a linear grating, the period of the printed pattern is half that of the grating in the mask.

U.S. Pat. Nos. 8,368,871 and 9,036,133 teach modifications of the ATL and DTL techniques in which each point of the mask pattern is illuminated by light having an extended angular distribution, that is, not by collimated light but by light with intensity components at different angles of incidence. They teach various embodiments in which the angles of the components are selected such the printed features have a particular resolution, shape or array symmetry that is different from that of the features in the mask.

U.S. Pat. No. 8,525,973 discloses a method for reducing the sensitivity of DTL and DTL-based exposure schemes solution to deviations of the change of separation between the mask and substrate during exposure from an exact integer multiple of the Talbot distance. It teaches that the exposure dose illuminating the mask per incremental change of separation of the mask and substrate is not constant during the change of separation but is varied in a particular manner. In particular it advocates that the exposure dose per incremental displacement of the substrate should vary according to a Gaussian profile, either by varying the illumination intensity or by varying the speed of displacement. It teaches that the change of separation over which the speed or intensity is varied should be greater than the Talbot distance.

U.S. Pat. No. 8,904,316 describes further modifications of the ATL and DTL techniques in which a variety of designs of phase-shift mask are employed to print patterns that have a smaller period or different array symmetry with respect to those in the mask.

U.S. Pat. No. 9,182,672 describes an exposure method related to DTL in which a mask defining a periodic pattern is tilted at a selected angle respect to a substrate to be printed and during exposure the substrate is laterally displaced parallel to the plane of tilt. This exposes the substrate to the range of transversal intensity distributions between successive Talbot planes and so prints essentially the same pattern as ATL and DTL techniques and provides the same advantages.

U.S. Pat. No. 9,280,056 describes a related technique in which a periodic pattern in a mask disposed in proximity to a substrate is illuminated by a collimated beam whose wavelength is scanned across a spectral bandwidth during the exposure. The bandwidth is arranged in relation to the separation of the substrate and mask so that the mean intensity distribution exposing the substrate is equivalent to that produced by ATL.

U.S. patent application Ser. No. 14/123,330 describes a further related technique in which an array of lasers emitting light at a plurality of wavelengths over a spectral bandwidth is employed to illuminate a periodic pattern in a mask in proximity to a substrate. The bandwidth of wavelengths and the separation of the substrate and mask are arranged so that the resulting exposure of the substrate is similarly equivalent to that produced by ATL.

U.S. Pat. No. 9,658,535 describes two further DTL-related exposure schemes for printing periodic patterns with uniformity onto a substrate. In both schemes the period of the mask pattern is selected in relation to the illumination wavelength so that only $0^{th}$ and $1^{st}$ orders are diffracted by the mask. In the first scheme, N sub-exposures of the mask are performed with the separation between mask and substrate being changed between sub-exposures by certain fractions of the Talbot distance. In the second scheme, the substrate is exposed in a number of sub-exposures to the same intensity distribution formed by the mask pattern with the substrate being laterally displaced by certain fractions of the pattern period between the sub-exposures. Using both schemes, the integrated intensity distribution of the sub-exposures prints a pattern that is equivalent to that obtainable using DTL.

U.S. Pat. Nos. 8,524,443 and 9,007,566 describe further exposure schemes related to ATL and DTL for printing linear grating patterns into a photosensitive layer on a substrate. In these schemes a grating pattern in the mask is illuminated with monochromatic light that has a range of angles of incidence in a plane parallel to the grating lines. The light at a particular angle of incidence forms Talbot image planes with a particular separation, and the range of angles is selected so that the Talbot image planes formed by the different angles of incidence superpose to produce an intensity distribution at the substrate that is constant in the direction orthogonal to the mask; thereby equivalent to that produced by DTL or ATL. The disclosures describe various optical arrangements for illuminating a mask uniformly with the required range of angles of incidence either simultaneously or sequentially. They describe a scheme in which light with a Gaussian intensity profile converges or diverges onto the mask with the required range of angles and so that the beam at the mask has a diameter much smaller than the pattern in the mask. Exposure is performed by scanning the Gaussian-profile beam in a raster pattern over the mask with consecutive scan passes being partially overlapped, so that the time-integrated exposure energy density prints a uniform grating onto the substrate. In another embodiment an elongated beam is formed whose light is collimated with uniform intensity in the direction of elongation and converges onto the mask with the required range of angles of incidence in the orthogonal plane. Exposure is performed by scanning the beam in a single pass in the direction of the grating lines over the length of the grating, also resulting in a uniform grating on the substrate. In a further embodiment described in U.S. Pat. No. 9,007,566, a similarly elongated beam that is collimated with uniform intensity along the length of the beam and converges with the required range of angles in the orthogonal plane illuminates instead an elongated grating pattern in the mask. In this case exposure is performed by scanning the photoresist-coated substrate in the direction of the grating lines, thereby producing the same printed result. This disclosure further mentions that following the exposure the substrate may be displaced by the length of the mask grating in the direction of grating elongation and then a second, identical exposure performed so as to print a second grating pattern alongside the first, whereby a composite grating is printed on the substrate that has twice the length of the mask grating. The resulting composite grating, however, is not at all continuous or "seamless" across the border between the 2 exposures, for reasons that are explained below.

A difficulty with the teachings of the prior art on DTL and DTL-related techniques is their applicability to very large periodic patterns, such as patterns whose x/y dimensions are larger than ~300×300 mm, as may be required for such applications as pulse compression gratings, spectrometer gratings, photovoltaics/solar cells and polarizers for large displays. For performing "full-field" ATL or DTL exposures of such patterns, i.e. without any scanning of the illumination beam, a well-collimated exposure beam is required whose dimensions are larger than the size of the printed pattern. Obtaining a suitably-sized collimating lens of sufficient quality may not be possible or can be prohibitively expensive. Scanning instead a beam with a Gaussian intensity profile with partially overlapping scan passes across a large pattern, as described in U.S. Pat. No. 8,524,443, enables a much smaller collimating optic to be used; but this strategy can require a very large number of scan passes, which is undesirable if a short exposure time and high throughput are required for a production process. Moreover, this strategy is unsuitable if it is not possible to produce a beam with a sufficiently Gaussian intensity profile, as may be the case for an excimer laser operating at a deep-UV wavelength. Scanning instead an elongated beam with constant intensity along its length in a single pass across the mask pattern, as also described in U.S. Pat. No. 8,524,443, enables the collimating optic to be much smaller in one direction but does not relax the requirement in the orthogonal direction, so can also be problem for lens manufacture. Nor is it feasible, using the teaching of the prior art, to scan such an elongated beam in a raster pattern across a larger mask pattern with an overlap between successively scanned regions and a distance of overlap corresponding to the distance over which the intensity falls to zero, in the direction of beam elongation, at the ends of the elongated beam. This is because the intensity at the ends of the elongated beam disclosed in the prior art falls to zero in an uncontrolled and arbitrary way, and so the superposition of the overlapped exposures would result in an unacceptably high variation of the integrated exposure energy densities across the overlap regions. The fields of application addressed typically require very good exposure uniformity of <±3%. It would also not be helpful to truncate the elongated beam before the fall-off regions by, for example, inserting an aperture to produce a beam with a perfectly rectangular intensity profile along the beam, and then to raster scan this truncated beam with no overlap or gap between successive scan passes. This would be unsuccessful because DTL and DTL-related exposure methods rely on the interference of diffracted beams transmitted by the mask, and so require a uniform overlapping of the diffracted beams at the photoresist-coated substrate to produce a uniform result. The diffracted beams diverge after the mask, however, and so the edges of the diffracted beams produced by each end of the truncated elongated beam separate laterally as the beams propagate towards the substrate, which consequently results in an imperfect overlapping and non-uniform interference of the diffracted beams in the photoresist at the ends of the elongated beam.

An additional problem with raster scanning an elongated beam with an overlap between successive scan passes is that the local angle of incidence of the beam at the mask in the plane of diffraction from the grating needs to be accurately the same for the two scans of successive passes in any overlapping region. If the angles of incidence are not accurately the same, then the features of the periodic patterns printed by the two exposures will not be accurately aligned in the overlapping regions for ensuring a desired uniformity of the printed grating. The elongated-beam scanning systems and procedures described in the prior art do not discuss or control the relative angle of incidence of the light at the mask in the overlapping region at one end of the elongated beam with respect to that at the other end of the beam. Although they mention that the light is collimated in the plane of elongation, this rather refers to and restricts the range of angles of incidence illuminating any particular point of the mask, which is important to ensure that the lines in the grating printed from just a single scan of the elongated beam are well resolved.

SUMMARY OF THE INVENTION

It is an object of the present invention to provide a method and apparatus for printing very large periodic patterns with high uniformity using DTL or DTL-related techniques.

It is a further object that the method and apparatus be applicable to both one-dimensional and two-dimensional periodic patterns, in particular to linear gratings, hexagonal and square arrays of features, and be applicable also to quasi-periodic patterns, that is, to patterns whose periodicity varies slowly across the pattern.

It is a further object of the invention that the method and system enable the very large periodic patterns to be printed in a short exposure time, so as to enable a high throughput of printed substrates for a production process.

According to a first aspect of the present invention, a method is provided for printing a desired uniform periodic pattern of linear features into a photosensitive layer on a substrate, which method includes:

a) providing a mask bearing a mask pattern of linear features that are parallel to a first direction and have a period that is twice that of the desired pattern;
b) arranging the substrate parallel to the mask and with a separation from the mask pattern;
c) generating an elongated beam of monochromatic light and directing it to the mask so that the light of the elongated beam illuminates the mask with a range of angles of incidence in a plane orthogonal to the direction of elongation and parallel to the first direction and so that the light of the elongated beam, in a plane parallel to the direction of elongation, is well collimated and has uniform power per incremental distance along the length of the elongated beam except at the two ends of the beam where the power per incremental distance falls to zero according to a first profile over a fall-off distance at one of the beam and according to a complementary, second profile over the fall-off distance at the other end of the beam, wherein the range of angles is selected in relation to the wavelength of the light, the separation of the mask and substrate and the period of the mask grating so that the light diffracted by the mask forms an intensity distribution at the substrate that is uniform in the direction orthogonal to the plane of mask;
d) scanning said elongated beam in a first sub-exposure in a direction parallel to the first direction across a first part of said mask pattern so as to print a first part of the desired grating on the substrate;
e) scanning said elongated beam in a second sub-exposure in a direction parallel to the first direction across a second part of said mask pattern that is offset from the first part in the direction of the beam elongation, such that the first and second parts of the mask pattern overlap by the fall-off distance, and such that the angle of incidence of the beam, in the plane parallel to the direction of elongation, in the area of the mask pattern where the first and second parts overlap is the same as in the first sub-exposure, so as to print a second part of the desired grating that overlaps with the first part of the desired grating;

wherein the first profile and complementary, second profile are selected so that the summation of the exposure energy densities exposing the mask pattern in the two sub-exposures is uniform in the area of the mask pattern where the first and second parts overlap and is the same as that in the areas of the mask pattern exposed by the section of the elongated beam that has uniform power per incremental distance.

Complementary is defined as meaning that the intensity fall-off profiles at the two ends of the elongated beam add up to produce a uniform intensity across the overlap region when the profiles are overlapped by the fall-off distance in the first and second sub-exposures.

Preferably, the power per incremental distance of the elongated beam falls off to zero at the ends of the elongated beam according to first and second profiles that are the same. Advantageously, the profiles are linear functions or 180° sections of a cosinus profile, the gradient of the profile being substantially 0 at the start at end of the profile.

The power per incremental distance along the length of the elongated beam refers either to the instantaneous power per incremental distance in case of a continuous-wave laser source or to the quasi-instantaneous power per incremental distance in the case of a pulsed laser source (i.e. averaged over multiple laser pulses), or in the case of an oscillating moving aperture being employed to produce a defined fall-off of the power per incremental distance at the ends of the beam, it refers instead to the time-averaged power per incremental distance over time-period duration of an oscillation of the aperture.

Advantageously, the method additionally includes scanning said elongated beam in a third sub-exposure in a direction parallel to the first direction across a third part of said mask pattern that is offset from the first and second parts in the direction of the beam elongation, such that the third part of the mask pattern overlaps by the fall-off distance with the first or second parts, and such that the angle of incidence of the beam, in the plane parallel to the direction of elongation, in the area of the mask pattern where the third and first or second parts overlap is the same, so as to print a third part of the desired grating that overlaps with the first or second parts of the desired grating. Further advantageously, a plurality of further parts of the desired grating are printed in further sub-exposures such that they superpose to form a larger desired grating on the substrate.

According to a second aspect of the present invention, a system is provided for printing a desired periodic pattern of linear features into a photosensitive layer, which system includes:
a) a mask bearing a mask pattern of linear features that are parallel to a first direction and have a period that is twice that of the desired pattern;
b) means for arranging the photosensitive layer parallel to the mask and with a separation from the mask pattern;
c) means for generating an elongated beam of monochromatic light and directing to the mask so that the light of the elongated beam illuminates the mask with a range of angles of incidence in a plane orthogonal to the direction of elongation and parallel to the first direction and so that the light of the elongated beam, in the plane parallel to the direction of elongation, is well collimated and has uniform power per incremental distance along the length of the elongated beam except at the two ends of the beam where the power per incremental distance falls to zero according to a first profile over a fall-off distance at one of the beam and according to a complementary second profile over the fall-off distance at the other end of the beam, wherein the range of angles is selected in relation to the wavelength of the light, the separation of the mask and substrate and the period of the mask grating so that the light diffracted by the mask forms an intensity distribution at the substrate that is uniform in the direction orthogonal to the plane of the mask;
d) means for scanning said elongated beam in a first sub-exposure in a direction parallel to the first direction across a first part of said mask pattern so as to print a first part of the desired grating on the substrate;
e) means for scanning said elongated beam in a second sub-exposure in a direction parallel to the first direction across a second part of said mask pattern that is offset from the first part in the direction of the beam elongation, such that the first and second parts of the mask pattern overlap by the fall-off distance, and such that the angle of incidence of the beam, in the plane parallel to the direction of elongation, in the area of the mask pattern where the first and second parts overlap is the same as in the first sub-exposure, so as to print a second part of the desired grating that overlaps with the first part of the desired grating;

wherein the first profile and complementary second profile are selected so that the summation of the exposure energy densities exposing the mask pattern in the two sub-exposures is uniform in the area of the mask pattern where the first and second parts overlap and is the same as that in the areas of the mask pattern exposed by the section of the elongated beam that has uniform power per incremental distance.

Preferably, the means for generating the elongated beam generates a power distribution along the length of the elongated beam that falls off to zero at one end of the beam according to a first profile and falls off to zero at the other end of the beam according to a second profile that is the same as the first profile. Advantageously, the first and second profile are the same linear profile or the same cosinus profile.

Preferably, the means for producing the fall-off of the power per incremental distance at each end of the elongated beam is a transmissive filter that is arranged across the width of the beam and whose absorption or reflection varies in a linear manner over the fall-off distance.

Advantageously the means for producing the fall-off of the power per incremental distance at each end of the elongated beam is a half-tone mask that is arranged across the width of the beam and is comprised of a periodic series of apertures each with a width substantially less than the width of the elongated beam so that a plurality of apertures intersect the beam, and where the shape of the apertures is designed so that the mean transmission of the series of apertures at a particular distance across the fall-off region in the direction of beam elongation varies with the particular distance according to the selected first or second profile, and such that substantially all the light of the orders diffracted by the periodic structure of the aperture array exposes the photosensitive layer.

Alternatively, the means for producing the fall-off of the power per incremental distance at each end of the beam is produced by a $0^{th}$-order half-tone mask that is arranged across the width of the beam and that is comprised of a two-dimensional array of cells in each of which is a grating with a period whose duty-cycle and/or fill-factor varies within each cell or from cell to the direction of beam elongation so as to generate the selected first or second profile function of fall-off of the power per incremental distance in the $0^{th}$ order transmitted by the grating array. The period of the gratings in the cells is selected to be sufficiently small in relation to the wavelength of illumination and in consideration of the geometry of the means for beam generation and scanning so that the $1^{st}$ and higher diffraction orders spatially separate from the $0^{th}$ diffracted order and can be blocked before they illuminate the pattern in the mask.

Alternatively, the means for producing the fall-off of the power per incremental distance at each end of the elongated beam comprises an aperture with a straight edge that is orthogonal to the direction of beam elongation, which is mounted to a translation stage for displacing the aperture in the direction of beam elongation. The stage is controlled by a computer which produces an oscillation of the position of the aperture, preferably according to a triangular/saw-tooth or sinusoidal curve so that the time-averaged fall-off of the power per incremental distance transmitted by the oscillating aperture varies in a linear or cosinusoidal manner in the direction of the beam elongation. The translation stage is preferably a linear motor that enables the aperture to be oscillated at a sufficiently high frequency in relation to the scanning speed of the elongated beam so that the time-integrated exposure energy density of the pattern in the mask in the direction of scanning has the required uniformity.

Yet alternatively, the means for producing a linear fall-off of the power per incremental distance at each end of the elongated beam comprises an aperture mounted to a rotation stage, the shape of the aperture being designed so that the radius of the edge of the aperture from rotation axis varies in a linear manner with increasing rotation angle except for an angle at which the radius reverts immediately back to its initial value or returns linearly back to its initial value. The speed of rotation of the motor is selected to be sufficiently high in relation to the scanning speed of the elongated beam such that the time-integrated exposure energy density of the pattern in the mask in the direction of scanning has the required uniformity. The shape of the aperture may be alternatively designed to produce an intensity profile that falls to zero according to a cosinusoidal profile. For this, the distance of the edge of the aperture from the rotation axis should vary according to an inverse cosinusoidal profile as the aperture is rotated.

Preferably, the scanning means for the second sub-exposure includes means for displacing a part or all of the means for generating the elongated beam in a direction parallel to the beam elongation, or alternatively includes a means for displacing the mask and photosensitive layer in the direction parallel to the beam elongation, in order that that the areas of photoresist exposed in the first and second sub-exposures overlap by the fall-off distance.

DETAILED DESCRIPTION OF THE INVENTION

Figure 1:
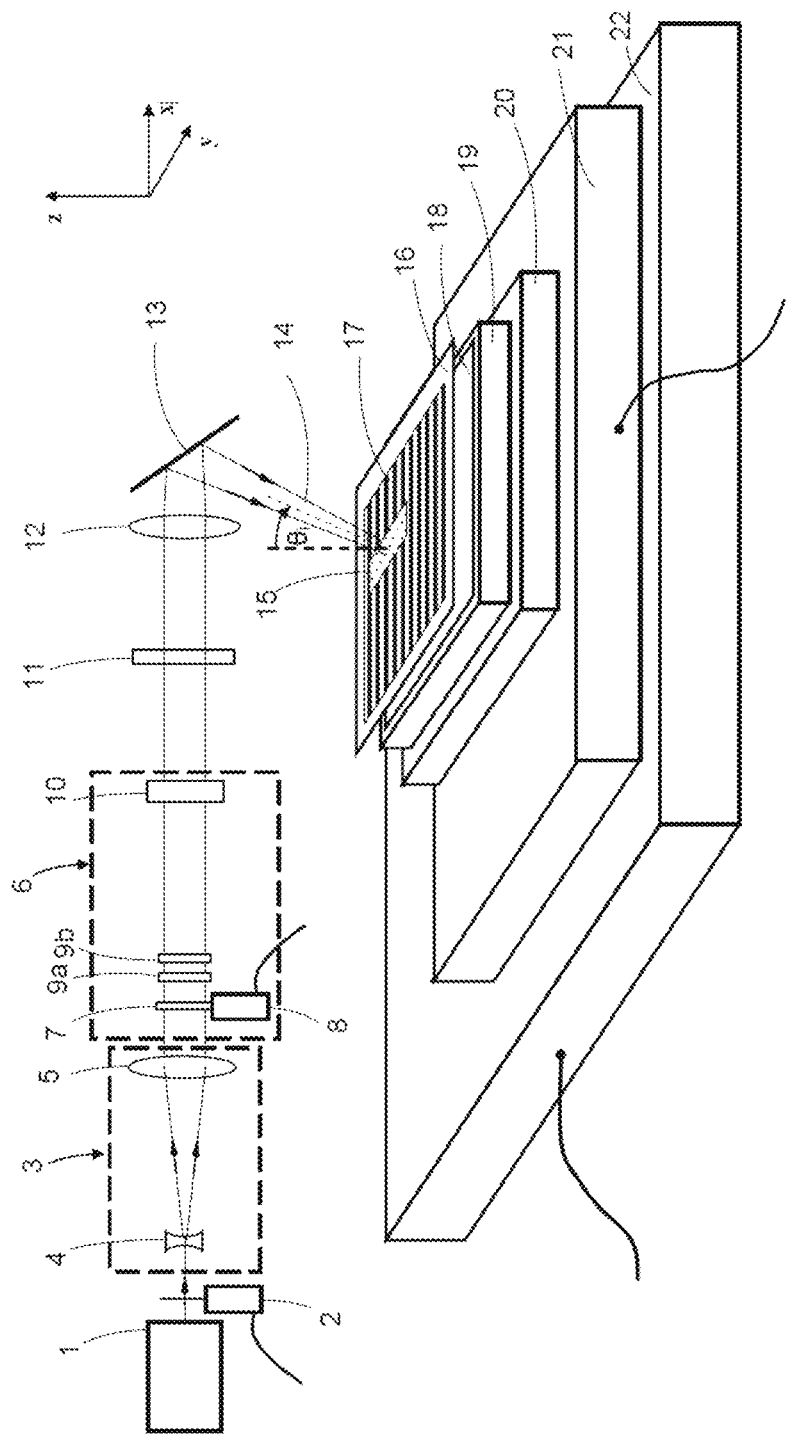
FIG. 1 schematically illustrates a first embodiment of the invention.

With reference to FIG. 1, a frequency-tripled diode-pumped solid-state laser 1 emits a high-frequency (many kHz) pulsed beam of light at 355 nm wavelength, that has a Gaussian intensity profile is polarized in the xz plane. The beam, after passing a shutter 2, is incident firstly on a xz-plane beam expander 3, comprising a cylindrical concave lens 4 that refracts the light in the xz plane and a cylindrical convex lens 5 that re-collimates the light in this plane to produce a beam with a $1/e^2$ diameter of ~10 mm. The beam is then incident on a xy-plane beam transformer 6, comprising firstly a linear diffuser 7 that scatters the light over a narrow range of angles in the xy plane. The diffuser 7 is mounted on a stage 8 for displacing the diffuser in the y direction during an exposure. The linearly scattered light from the diffuser 7 illuminates a tandem pair of cylindrical microlens arrays 9a and 9b that are arranged according to standard principles for beam homogenization in order to produce a uniform intensity distribution in the xy plane. Such cylindrical micro-lenses are available from such companies as Advanced MicroOptic Systems. A cylindrical lens combination 10 re-collimates the divergent light in the from the cylindrical micro-lenses 9a, 9b to produce an elongated beam with a substantially rectangular intensity profile over a length of >13 cm. At each end of the elongated beam, outside of this length, the intensity falls to zero in an arbitrary uncontrolled way.

As is well described in the prior art on DTL and DTL-related exposure schemes, the degree of collimation of the beam illuminating any particular point of the grating pattern in the mask needs to be sufficiently good in the plane of diffraction in order that the pattern printed on the photoresist-coated substrate is well resolved. The degree required depends on the period of the mask pattern and on the separation of the mask and substrate. Since the period of the grating to be printed in this embodiment is 0.25 µm and the mask-substrate separation to be used is 360 µm, the collimation required ~0.1 mR. The optical system shown in FIG. 1 is therefore designed according to standard optical principles in order to achieve this as well as to produce the required uniformity of intensity along the length of the elongated beam. It is additionally important in this and all other embodiments of the invention that the angle of incidence of the light at the mask at the ends of the beam, i.e. in the regions of the beam that produce the overlapping exposures, are accurately the same in the plane of diffraction, otherwise the grating lines printed in the two overlapping sub-exposures will not be accurately aligned, so could produce an unacceptable non-uniformity. The accuracy of angular alignment required is a small fraction, typically $\frac{1}{10}$, of the collimation required, so for this embodiment should be ~±10 µR. The optical system of FIG. 1, in particular the cylindrical lens combination 10, is therefore designed, assembled and adjusted according to standard optical principles, especially with respect to minimizing spherical aberrations. To facilitate the alignment of the optics and to verify that the angle of the light at the two ends of the beam is accurately the same, a "Laser Analyzing Telescope" of the type manufactured by the company Duma Optronics Ltd, Israel, may be used. The telescope focuses an illuminating collimated beam to spot on a high-resolution CCD array, and determines the angle of the beam from the position of the spot on the array with a measurement accuracy of <±5 µR. The relative angles of the light in the "overlap regions" at the two ends of the beam may thus be measured by viewing the light with the telescope mounted on a sufficiently flat surface and displacing it across the surface to measure the two ends of the beam. The angle of the light in the overlap regions of the elongated beam may be alternatively measured with respect to the mask (by measuring the angle of the beam reflected from the mask) prior to each sub-exposure so to ensure that the lines of the superposed printed gratings are accurately aligned in the overlap regions.

Figure 2:
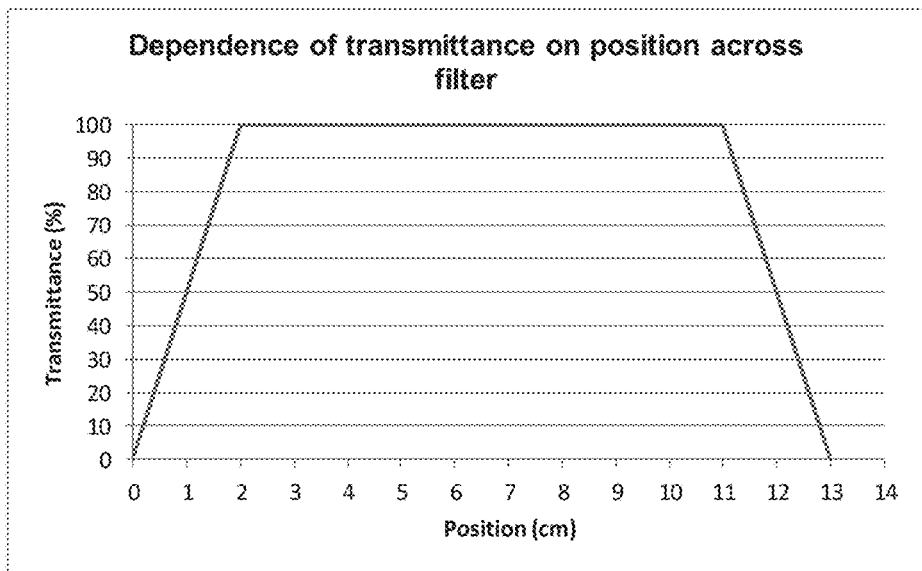
FIG. 2 shows the variation of transmission through an apodization filter employed in the first embodiment.
Figure 3:
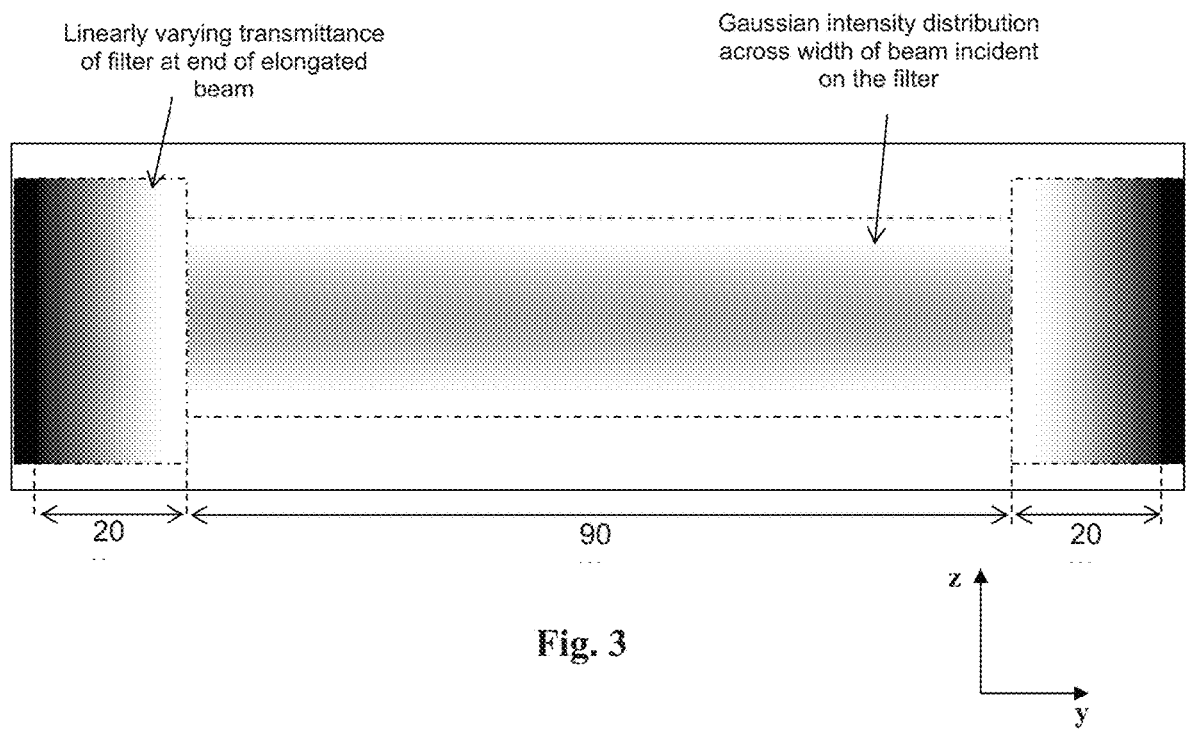
FIG. 3 schematically illustrates the intensity distribution of a beam incident on the apodization filter employed in the first embodiment.

The output beam of the xy-plane transformer 6 is then incident on an apodization filter 11 whose transmission varies in they direction over a ~13 cm length in the manner illustrated in FIG. 2. Such apodization, or linear variable neutral transmission, filters may be obtained from, for example, Reynard Corporation in the U.S. The variation of transmittance is produced by a variation in thickness, and therefore absorption, of a metal or metallic alloy on a fused silica substrate. The filter (and the apodization filters used in later embodiments) may be additionally coated with anti-reflection coatings to enhance the overall transmission. The beam transmitted by the apodizing filter is therefore uniform over a central section of length ~90 mm and its intensity falls linearly to zero over a distance of ~10 mm at each end of the beam. FIG. 3 illustrates the location of the filter in the illuminating beam. The transmitted beam is then focused in the xz plane by a cylindrical convex lens 12 such that the light rays at the $1/e^2$ intensity values converge with angles of ~±1.5°. The convergent beam is reflected by a mirror 13 which is inclined so that the beam is incident on a mask 16 with a mean angle of incidence of $\theta_i=5°$ in the xz plane and at substantially normal incidence in the yz plane. On the bottom surface of the mask 16 is a phase grating pattern 17 consisting of parallel lines with a period of 0.5 µm and line/space ratio of ~1 that are etched into a fused silica substrate so as to provide high $1^{st}$ order efficiency for light at 355 nm. The grating area is ~200 mm×200 mm and the pattern 17 is oriented with the grating lines in the x direction. Such a mask may be produced using standard e-beam lithography to form the pattern in a chrome mask, then RIE etching the spaces into the substrate and finally stripping the chrome. The mask pattern may be alternatively formed by holographic exposure or by DTL exposure from a master mask with twice the period, that is, 1 µm. Below the mask 16 is a substrate 18 coated with a layer of a standard i-line-sensitive photoresist. The substrate 18 is on a vacuum chuck 19 that is attached to a carriage 20 of an x-direction scanning stage 21, which is mounted onto a y-direction stepping stage 22. The stages are selected so that their pitch, yaw and roll characteristics are suitable for obtaining the required overlay accuracy of the grating lines in the regions of overlapping sub-exposures. In particular, their magnitude should preferably be less than the requirement on the angular alignment accuracy of the light in the overlap regions of the elongated beam, so should be preferably <±10 µR. As described above, the angle of incidence of the light on the mask (in the plane of diffraction of the grating pattern) in the overlap regions may be alternatively measured and adjusted prior to each sub-exposure, which relaxes the requirements on the yaw, pitch and roll motions of scanning and stepping stages. The mask 16 is supported from above by a vacuum chuck and a mask positioning system (not shown in the diagram) that enables the mask 16 to be arranged parallel and at a selected distance from the photoresist-coated substrate 18. The mask positioning system is also mounted to the carriage 20 of the x-direction scanning stage 21. Using the mask positioning system and a gap-measuring device of the type described in U.S. Pat. No. 8,368,871, the separation between the mask 16 and substrate 18 is adjusted to a value of ~360 µm. At this distance from the mask 16 the Talbot image planes produced by the different angles of incidence form, according to the teachings of U.S. Pat. Nos. 8,524,443 and 9,007,566, a continuum with increasing distance, and so the transversal intensity distribution becomes constant with further increase in distance from the mask.

Prior to the exposure, the positions of the carriage 20 on the scanning stage 21 and the position of the latter on the y-direction stepping stage 22 are arranged so that the section of the elongated beam 15 with uniform intensity can scan across the top (−y) half of the mask pattern. A first sub-exposure is performed by opening the shutter 2 and displacing the carriage 20 of the x-direction stage 21 so that the illumination beam 15 is scanned with constant speed across the length of the mask pattern 17 such that the top half of the mask pattern 17 receives a uniform time-integrated exposure across its complete length. The scan speed is selected in relation to the power per unit length of the beam 15 and the sensitivity of the photoresist so that the time-integrated energy density exposing the photoresist is suitable for forming the desired microstructure on the substrate 18 after photoresist development. During the exposure, the linear diffuser 7 is displaced back and forward in the y-direction with sufficient speed by the stage 8 so that intensity speckles are suppressed in the time-integrated exposure of the photoresist. Following the first sub-exposure, the shutter 2 is closed and the x-direction stage 21 is displaced on the y-direction stage 22 by an offset distance corresponding to the sum of the length of the elongated beam over which its intensity is uniform and the distance over which the intensity falls off to zero at the end of the beam, i.e. by 90+20=110 mm. A second sub-exposure is now performed in the same way as the first in order the bottom (+y) half of the mask pattern 17 receives a uniform time-integrated exposure across its complete length.

Figure 4:
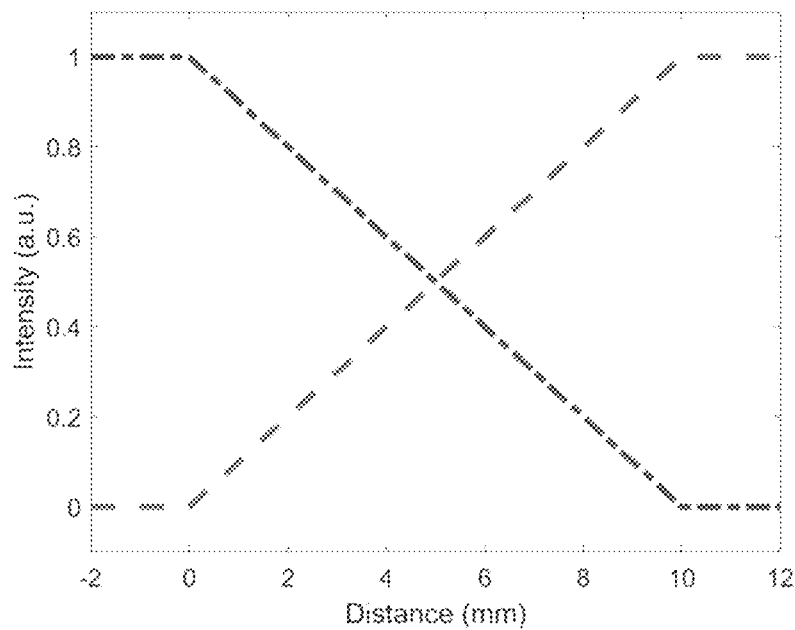
FIG. 4 illustrates the fall-off of relative intensity per incremental distance at the two ends of the elongated beam generated in the first embodiment.

Because of the offset distance in y selected between the two sub-exposures, the areas of the mask pattern 17 scanned in the two sub-exposure overlap by the fall-off distance of 10 mm. The direction of fall-off across the overlap region is opposite for the two sub-exposures and so the superposed energy densities add up to produce a uniform mask exposure across the overlap. The complementarity of the intensity fall-offs at the two ends of the beam, as illustrated in FIG. 4 for the case of a taper width of 10 mm, leads to a uniform intensity across the overlap region. However, because the grating pattern 17 in the mask 16 diffracts light in the y direction, a uniform mask exposure does not ensure that the intensity distribution exposing the photoresist is uniform across the overlapping sub-exposures.

Figure 5:
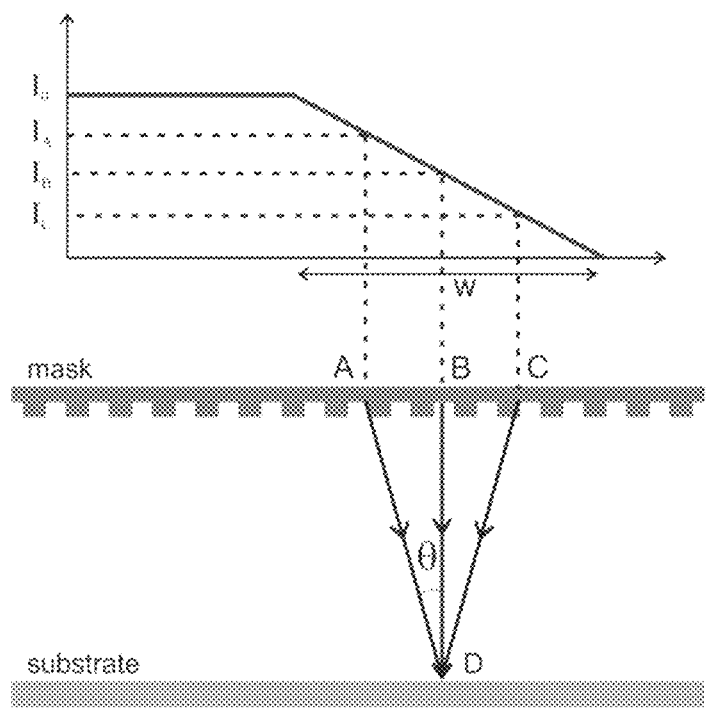
FIG. 5 illustrates the fall-off of intensity at the end of the elongated beam generated in the first embodiment and its illumination of a periodic pattern in a mask.

The intensity distribution of the aerial image exposing the photoresist is produced by the beams diffracted by the grating pattern 17 in the mask 16, as is schematically illustrated in FIG. 5. The graph at the top of the figure shows the linear fall-off of the intensity illuminating the grating in the mask at the edge for the exposure beam. The width of the intensity fall-off, or tapered region, is w. Point D on the photoresist is illuminated by $1^{st}$ diffraction orders emanating from points A and C on the mask grating and by $0^{th}$ order light from point B. The relative intensities of the uniform section of the beam and the light illuminating points A, B and C are respectively $I_0$, $I_A$, $I_B$ and $I_C$ as annotated in the graph.

The energy density distribution of the time-integrated aerial image formed at the photoresist by each sub-exposure in this embodiment (and indeed by any DTL- or ATL-related exposure scheme) can be determined by calculating the interference intensity distribution formed by each pair of $1^{st}$, $2^{nd}$ and higher orders diffracted by the mask and then adding them together with the 0th order distribution. The contrast of the integrated distribution is then given by $(I_{max}-I_{min})/(I_{max}+I_{min})$, where $I_{max}$ and $I_{min}$ are the maximum and minimum values of intensity across the integrated distribution.

Figure 6:
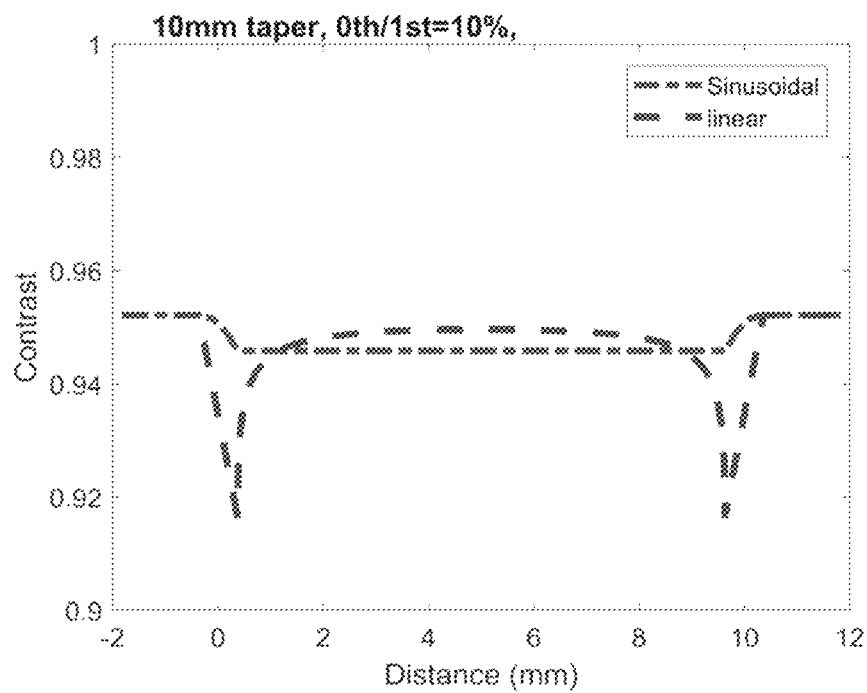
FIG. 6 illustrates the variation of contrast of the DTL-exposed image produced across the overlap region by two sub-exposures with the elongated beam being stepped between sub-exposures and with either a linear or cosinusoidal fall-off of intensity over a fall-off distance of 10 mm at the ends of the elongated beam in the overlap region, as described in the first and second embodiments.

Performing this calculation across a 10 mm-wide tapered region for each sub-exposure and adding the two distributions together produces the dashed curve shown in FIG. 6. As can be seen, there is a certain dip of the contrast in the transition region where the tapering starts and ends, but the contrast remains above 90% across the overlap region, demonstrating the effectiveness of the technique. A 20 mm-wide taper reduces the dip further and is found to improve the uniformity by more than a factor of two. The width of the taper at the end of the elongated beam should therefore be selected according to the required uniformity of the printed pattern.

Following the $2^{nd}$ sub-exposure the substrate 18 is removed from the exposure system and the photoresist is developed using standard techniques. The resulting seamless grating has, in accordance with the teaching of U.S. Pat. No. 8,368,871, a period of 0.6 µm, i.e. half of that of the grating in the mask. Further exposures using further photoresist-coated substrates may be performed to optimize the exposure conditions depending on the requirements of the application.

Whereas FIG. 1 schematically shows a particular arrangement of optics for generating an elongated uniform beam and directing it at the mask 16, it should be understood that this is only an example and that many equivalent variations may be conceived by those normally skilled in optics design. For example, the main optical system may be configured vertically, the cylindrical lens 12 shown before the mirror 13 may instead be after the mirror, the z-direction expansion module 3 and y-direction transformation module 6 may be interchanged with or without suitable modification of the internal optical components, the beam homogenization along the direction of elongation may be performed by means other than with microlens arrays 9a, 9b, the z-direction beam expansion in module 3 may be instead performed by two convex cylindrical lenses, the range of angles in the xz plane introduced by the convex cylindrical lens 12 may be alternatively introduced by a concave cylindrical lens that produces a divergence rather than a convergence of the light towards the mask, and y-direction beam expansion may be included before the microlens arrays 9a, 9b. It should be further understood that the optical elements and their relative sizes and positions are only shown schematically in FIG. 1. For example, the cylindrical lens combination 12 which is shown as a single lens is preferably composed of a number of cylindrical lens elements in order to minimize spherical aberration, the selection of which may be routinely determined and optimized by one normally skilled in optical design according to the exact requirements of the application.

Figure 7:
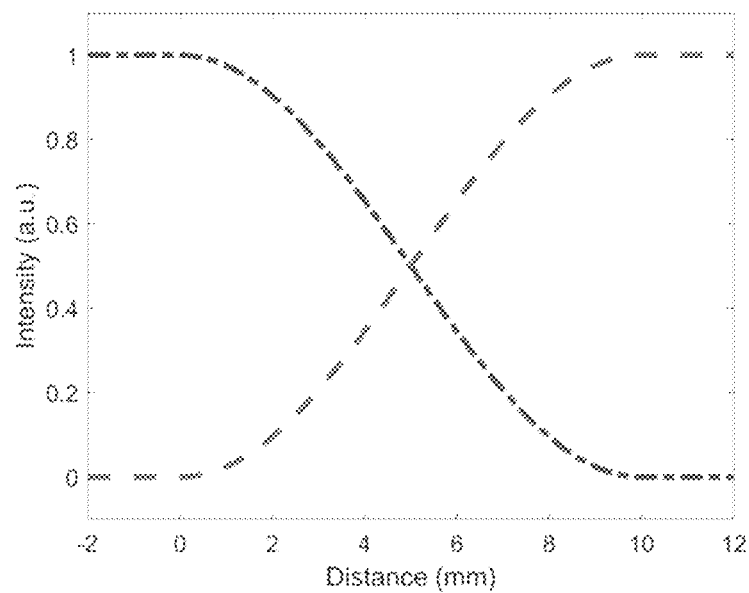
FIG. 7 illustrates the cosinusoidal fall-off of intensity at the two ends of the elongated beam employed in the second embodiment.

In a second embodiment, essentially the same exposure system and procedure as in the first embodiment are employed except that a different apodization filter is used, one whose transmittance varies at each of the beam according to a cosinusoidal profile and with the same fall-off distance of 10 mm. The complementarity of the cosinuosoidal intensity fall-offs at the two ends of the beam, which leads to a uniform intensity across the overlap region, is illustrated in FIG. 7. Using the same theoretical method to calculate to variation of the contrast across the overlap region of the two sub-exposures yields the curve depicted in the dashed-dotted form shown in FIG. 6. As can be seen, the overall variation in contrast is significantly less than that obtained with linear fall-off filter and there is smoother transition at the two ends of the taper, i.e. without the dips present in the blue curve of FIG. 6. Other apodization filters with similarly smooth transition profiles can be expected to similarly reduce the contrast variation. Simulations such as the one described here can be used to optimize this profile. When choosing the taper profile one must ensure that the summation of the intensity of the two beams remains constant (and equal to untampered regions) over the seam region. Variations in this summation, for example up to 1%, 5% or 10%, may be allowed depending on the uniformity requirements of the performed exposure.

Figure 8:
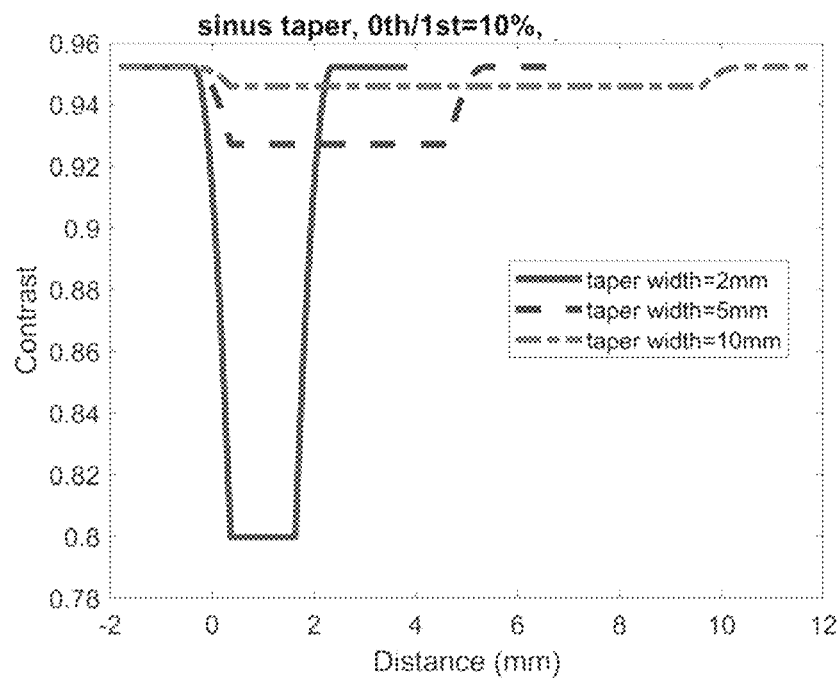
FIG. 8 illustrates the dependence of the variation of contrast across the overlap region on the width of the fall-off region in the case of a cosinusoidal fall-off of intensity at the ends of the elongated beam.

FIG. 8 illustrates the dependence of the uniformity across the overlap region on the width of the taper in the case of a cosinusoidal taper profile. The illumination wavelength and mask properties are same as the ones used in the previous example. Three plots show the image contrast for three different widths (2 mm, 5 mm and 10 mm) of the taper region. As the figure shows the degradation in contrast goes down strongly with increasing taper width. Depending on the requirements of the exposure one can choose the required taper width.

Figure 9:
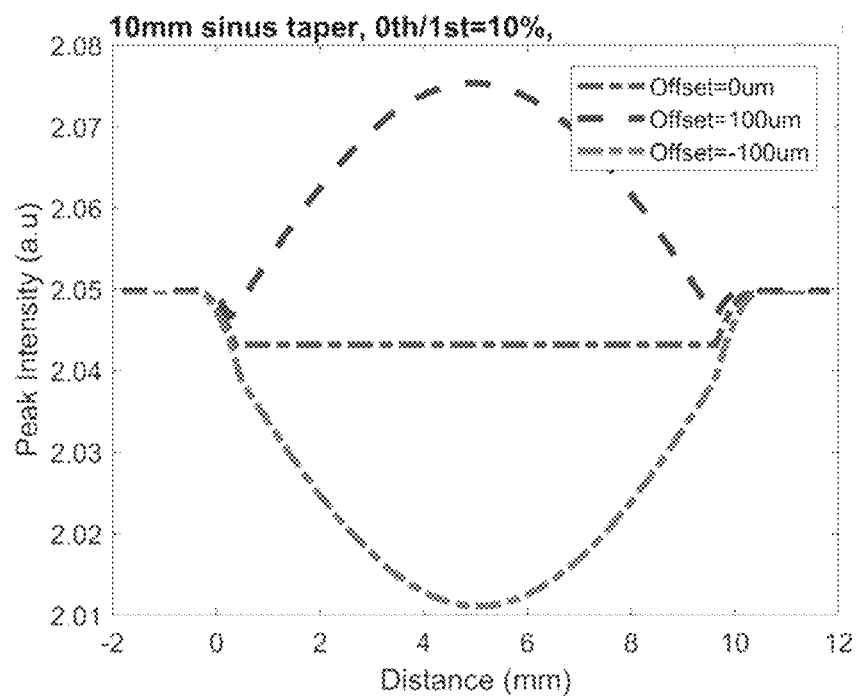
FIG. 9 illustrates the sensitivity of the peak intensity in the DTL-exposed image produced across the overlap region to a lateral offset, from the ideal position, of the elongated beam employed in the second sub-exposure in the case of a cosinusoidal fall-off profile.

FIG. 9 illustrates the sensitivity of the intensity across the overlap region on an offset of the two exposed areas from the ideal relative positions for the case of a cosinusoidal taper profile. The parameters of the mask and the wavelength are same as described in the previous examples and the taper width is again 10 mm. Three plots are shown corresponding to three different positioning of the two exposures on both sides of the seam region. In the first, perfectly aligned, case (offset=0 um) the two tapers are positioned so that the total illuminating beam intensity remains constant. In the second and third cases the tapers are displaced in the lateral direction (direction parallel to the mask surface and perpendicular to grating lines in FIG. 5) by a certain amount. In the second case (offset=100 um) the two exposures are moved towards each other (i.e. the beam overlap is increased) by 100 um. This leads to an increase of peak image intensity in the overlap region. In the third case (offset=−100 um) the two tapered beams are moved away from each other (i.e. the beam overlap is decreased) by 100 um. In this case a decrease of peak image intensity in the overlap region is calculated. The plots show that the effect on exposure intensity is approximately 1% for a 100 um error in beam positioning. Based on such results and the printing uniformity required for the particular application, the accuracy required of the stepping of the illumination beam between the two sub-exposures, which is equivalently performed by the y-stepping stage 22 in FIG. 1, may be appropriately determined.

Figure 10:
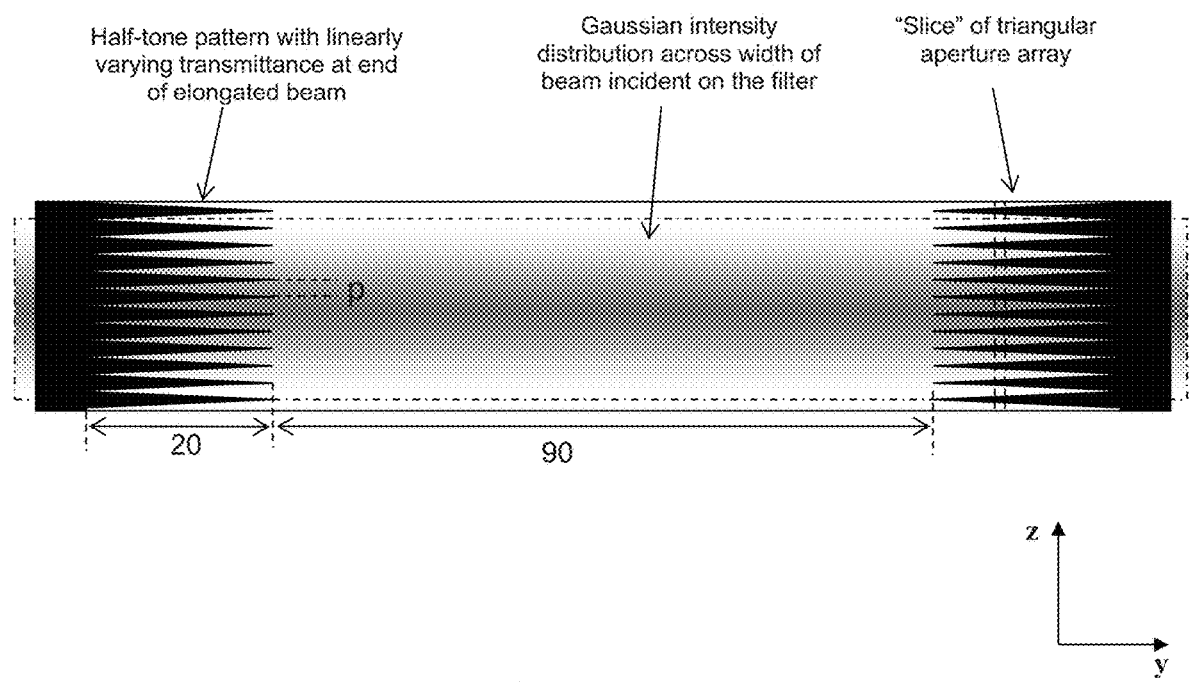
FIG. 10 illustrates the design of a half-tone mask and its arrangement with respect to an illuminating beam employed in the third embodiment.

In a third embodiment, essentially the same exposure system and procedure as in the first embodiment are employed except that a different type of apodization filter is used, one whose linear variation of transmittance at each end of the elongated beam is produced instead by a half-tone mask. The pattern is formed using standard chrome mask fabrication techniques on a fused silica substrate. With reference to FIG. 10, the pattern for apodizing each end of the elongated beam is a "saw-tooth" pattern comprising a periodic sequence of triangular apertures that extends across the complete width of the elongated beam (i.e. in the z direction). Because of the triangular shape of the apertures, the mean transmittance of a slice of the aperture array varies linearly in the y-direction from the apex of the apertures to their base. The period of the apertures selected should be substantially smaller than the width of the illuminating elongated beam, so that the variation of transmitted intensity across the width of the beam approximates well to a Gaussian profile. Preferably, the saw-tooth period should be $\leq 1/10$ of the $1/e^2$ beam diameter of the illuminating Gaussian beam, so ~1 mm is suitable for this embodiment. The period should be very much larger than the wavelength so that diffraction orders generated by the periodic aperture array (and the large spatial coherence of the illuminating beam in the z-direction) diverge at small angles (preferably <1°) so that they propagate through the subsequent optics to the exposure plane. For the same reason, the smallest space in a slice of the saw-tooth pattern at which the mean intensity of the slice is important for ensuring good uniformity in the overlap region should preferably be least 20 times the wavelength, so in this embodiment the smallest space is preferably >7 μm (a slice with 10 μm-wide space produces a mean intensity of 10 μm/1 mm=1%). Whereas the individual apertures in this embodiment have a triangular shape in order to produce a linear fall-off of intensity at the ends of the beam, it is clear that other shapes of aperture may be employed for obtaining other profiles of fall-off, for example a cosinusoidal shape may be used for obtaining a cosinusoidal fall-off.

In a modification of this embodiment, the saw-tooth apodization filter is additionally oscillated in the z-direction (see axes in FIG. 10) during the exposure by at least one period of the aperture array, in order that the z-direction intensity distribution of the transmitted beam has a more Gaussian profile.

Figure 11A:
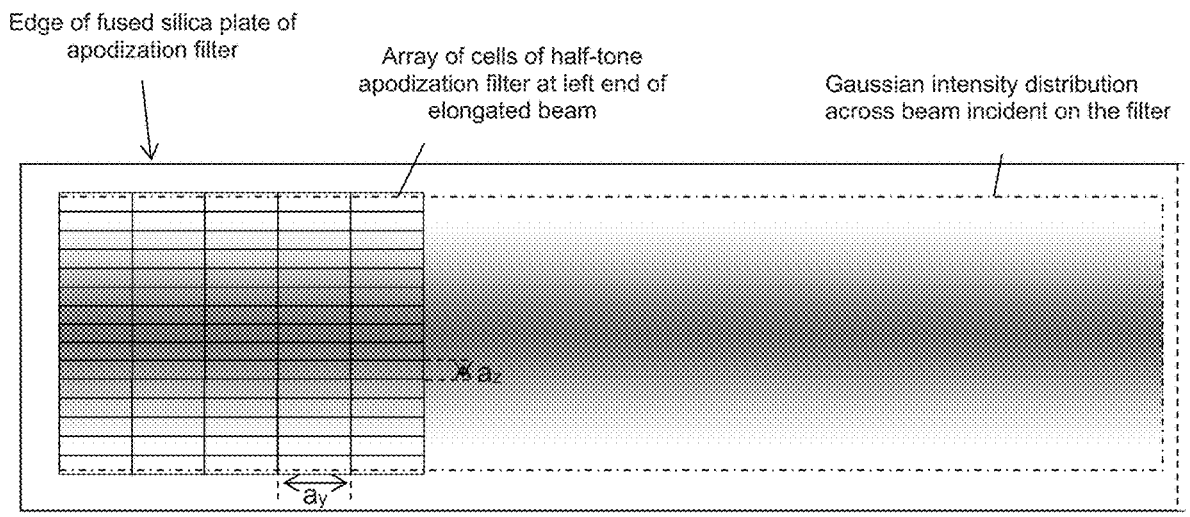
FIGS. 11a and 11b illustrate respectively the global design and single-cell design in an area of a $0^{th}$-order half-tone mask employed to produce a fall-off of intensity at one end of an elongated beam in the fourth embodiment.
Figure 11B:
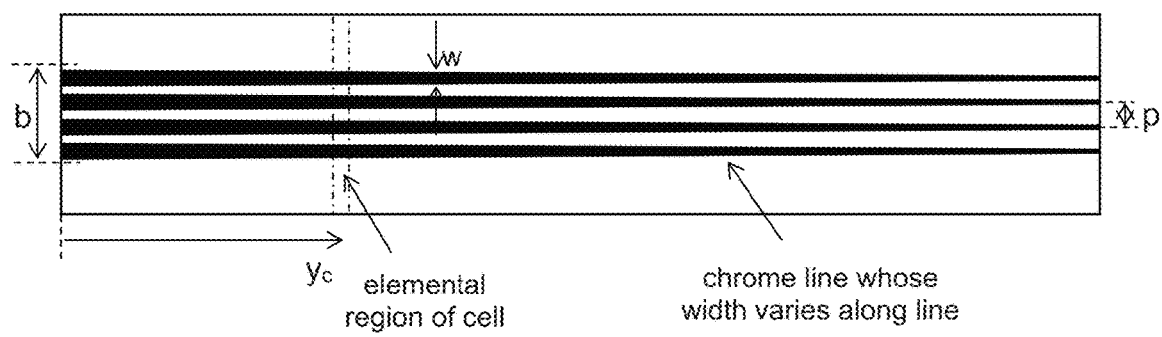

In a fourth embodiment, essentially the same exposure system and procedure as in the third embodiment are employed except that a different type of half-tone apodization filter is used. Whereas in the third embodiment essentially all the diffraction orders generated by the periodic nature of the filter propagate to the exposure plane, in this embodiment a $0^{th}$-order half-tone mask is used so that only the $0^{th}$-diffracted order propagates to the exposure plane. As in the previous embodiment the filter is formed as a pattern in chrome on a fused silica plate using standard mask making lithographic techniques. FIGS. 11a and 11b illustrate schematically the design of the filter at the left end of the elongated beam. The filter is positioned at the end of the uniform part of the beam incident on the filter (i.e. not in the region where the intensity falls off to zero after the filter). The filter is composed of an array of cells each of dimensions $a_y \times a_z$ (the y and z axes being consistent with those shown in FIG. 1). Within each cell there is an amplitude grating with the same period p, whose lines and spaces are parallel to the y axis in order that the $1^{st}$ and higher orders diffracted by the gratings are diffracted orthogonal to the direction of beam elongation. The period of the grating in each of the cells is selected to be 10 µm so that the resulting angle of the first diffraction orders (~2°) enables them and higher orders to be blocked at a distance of ~50 cm after the apodization filter where they have separated from the main beam (whose ~$1/e^2$ width is ~10 mm) so that just the $0^{th}$ order propagates to the exposure plane. The length of the grating lines and spaces within each cell is the same and corresponds to the length of the cell, $a_y$, and the width of the grating, b, is the same from cell to cell in the z direction but varies from cell to cell in the y direction. The ratio $b/a_z$ is hereafter referred to as the cell fill factor. The width of the chrome lines varies along the length of the lines within each cell, the variation being the same from cell to cell in the z direction (so the transmittance of the filter is constant in the z direction) but varies from cell to cell in the y direction. The ratio of the width of the chrome to the grating period, w/p, is hereafter referred to as the duty cycle.

The mean transmittance, T, of an elemental region at y coordinate, $y_c$, of each cell depends on the local efficiency of the $0^{th}$ order diffracted by the region, and on the fill factor of the grating in the cell. It may be calculated from:

$$T = 1 + \frac{b}{a_2}\left\{\left(1 - \frac{w}{p}\right)^2 - 1\right\}$$

Figure 12:
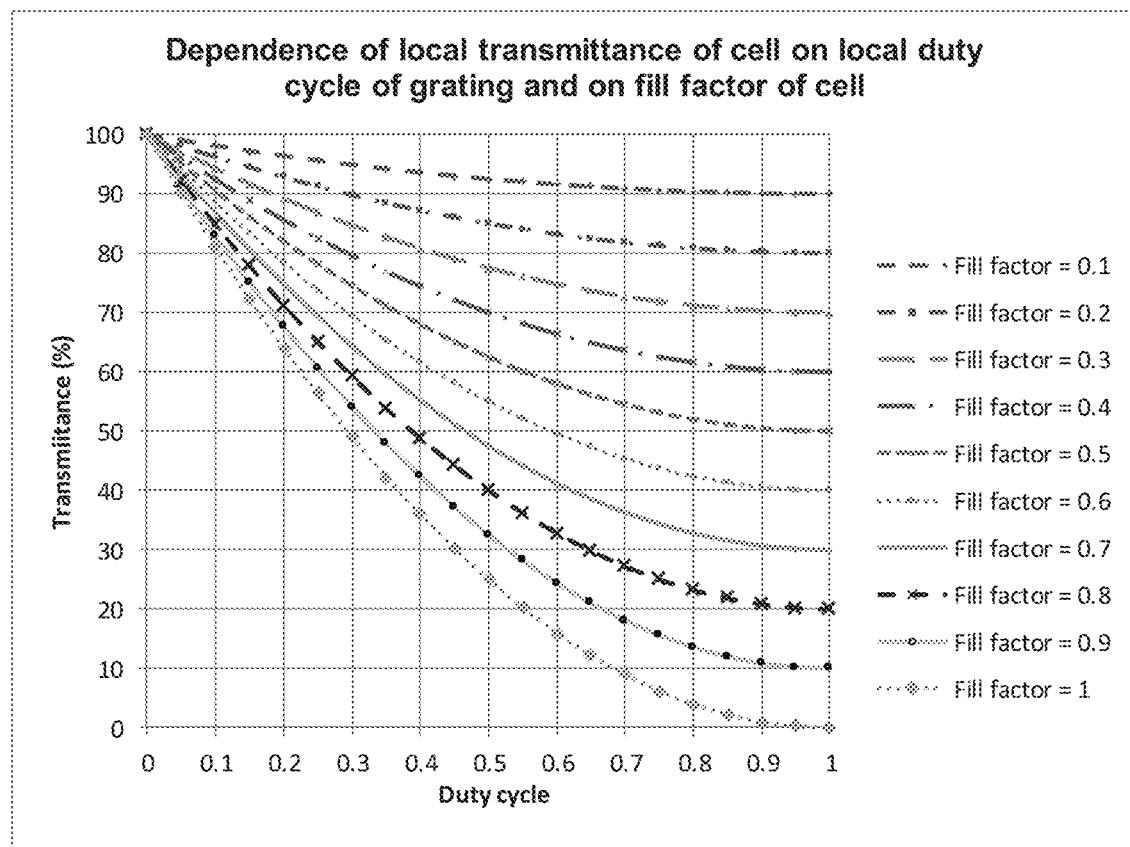
FIG. 12 illustrates the dependence of the local transmittance of a cell on the local duty cycle and fill-factor of the cell in a $0^{th}$-order half-tone mask design employed in the fourth embodiment.

FIG. 12 shows the range of transmittances possible from varying the duty cycle from 0 to 1 and from varying the fill factor from 0.1 to 1. From this it can be seen that all values of transmittance from 0 to 100% are obtainable with suitable choice of duty cycle and fill factor, and without requiring the duty cycle to be too small (e.g. <0.025) or too large (e.g. >0.975) that it becomes a problem to form the linewidth of chrome in the mask. The value of $a_z$ should be small in relation to the $1/e^2$ width of the illuminating beam, but large in relation to the period of the filter gratings in the filter. Typically, 1/10 of the $1/e^2$ beam width may be used, so ~1 mm for the case considered here. The value of $a_z$ should be much larger than the wavelength to ensure that negligible diffraction is produced by the cells in the y direction, which would degrade the resolution of the printed image. In a variant of this embodiment the grating elements in the $0^{th}$ order halftone mask are instead phase gratings.

In a variant of this fourth embodiment, the structure of the half-tone mask forming the fall-off of intensity distribution at each of the end of the elongated beam is a one-dimensional grating of the type employed in the third embodiment, that is, with duty cycle varying along the lines in the direction of beam elongation, but the period is selected to be much smaller than employed in the third embodiment in order that the $1^{st}$ and higher-order transmitted beams are diffracted at much larger angles so that they can be blocked before they illuminate the periodic mask pattern in the exposure plane, and the variation of duty cycle along the lines of the half-tone mask is designed so that the relative intensity of the $0^{th}$-order diffracted beam varies over the fall-off distance to produce the required profile of intensity variation (or power per incremental distance variation). Other designs of $0^{th}$-order half tone mask that produce the required variation of $0^{th}$-order intensity in the fall-off regions at the ends of the elongated beam, while blocking or deflecting away the $1^{st}$ and higher diffracted-order beams, may be employed in other variants of this embodiment.

In further embodiments, essentially the same apparatus as the first embodiment is employed, except that the intensity fall-off at each end of the elongated beam is produced instead by different types of aperture that periodically displace with respect to the end of the beam. The resulting effective intensity transmitted at a point along the beam in the direction of beam elongation rather refers to the time-averaged intensity over the periodic motion of the aperture. The aperture may be made of an opaque material or a scattering material that effectively blocks the beam from reaching the substrate. The aperture may be placed near the substrate or some other place along the beam path.

Figure 13:
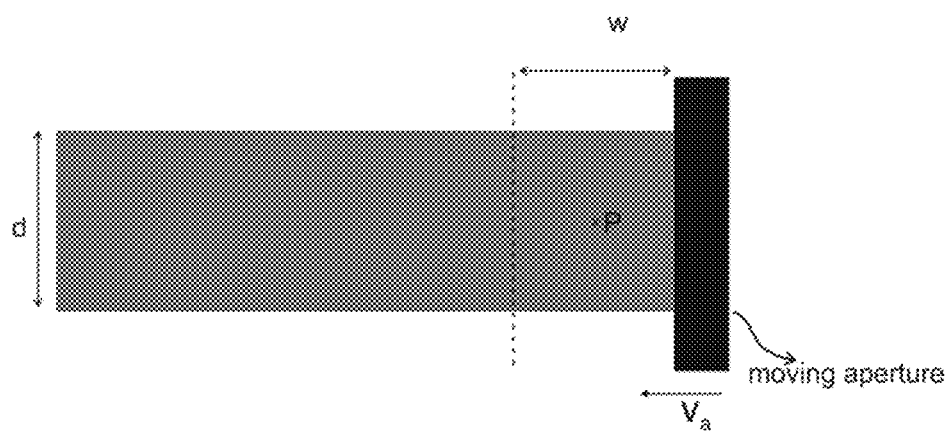
FIG. 13 illustrates an aperture displacing in the direction of beam elongation as employed in a fifth embodiment.

FIG. 13 illustrates an example of such an aperture employed in a fifth embodiment. The aperture has a straight edge and is repeatedly displaced, or oscillated, into and out of one end of the elongated beam by a distance w. The illuminating beam has a width of d in the vertical direction and is elongated in the horizontal direction. The profile of the oscillating motion (i.e. dependence of speed on position) of the straight edge is calculated to obtain the required intensity taper. Linear motors may be used to provide the actuation with sufficient speed and acceleration. Position sensors, such as interferometers or encoders can be used to measure the position of the aperture which can then be used to control the actuation to obtain a desired motion profile in a closed-loop operation. The movement speed should be adjusted according to exposure time to provide the desired intensity taper when it is averaged over the exposure duration. If the illuminating beam is pulsed then the time averaging operation should also take into account the pulse structure of the beam. If such an illumination beam is scanned over a stationary mask then the scan speed, and if present, pulse frequency of the illuminating beam, should also be considered in obtaining a desired intensity distribution (taper) after the time averaging operation. If the illumination is pulsed, the frequency of oscillation of the aperture is advantageously adjusted or varied during the exposure so as to avoid stroboscopic effects in the exposure. The moving aperture may be moved once or multiple times (e.g. back and forth) during the exposure.

Figure 14:
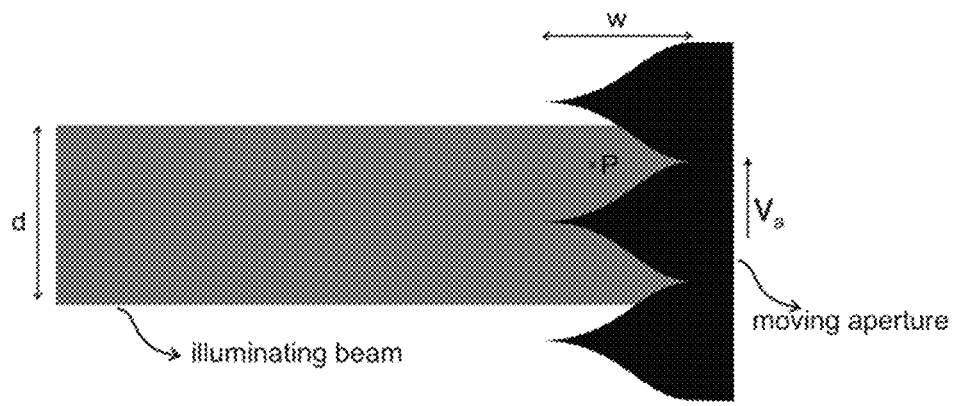
FIG. 14 illustrates an aperture displacing orthogonal to the direction of beam elongation as employed in a sixth embodiment.

FIG. 14 illustrates another example of an aperture that periodically displaces at each end of the elongated beam in a sixth embodiment. In this case, the aperture is repeatedly moved, in an oscillating motion in the vertical direction across the width of the end of the elongated beam to produce a desired intensity taper. Here the shape of the aperture determines the tapering profile. The required shape can be readily calculated by considering a certain point P in the taper area and calculating the open to closed time ratio as the aperture moves over it. For example to obtain a sinusoidal distribution an aperture similar to an inverse cosinus function can be used. Such an aperture can be made with current manufacturing techniques such as laser cutting or wire discharge machining. The speed of the aperture movement should be adjusted so that the desired intensity profile can be obtained after the time averaging operation with a desired accuracy. Also in this case the arguments with respect to exposure time, scan speed and pulse structure of the beam need to be taken into account in performing the time averaging.

Figure 15:
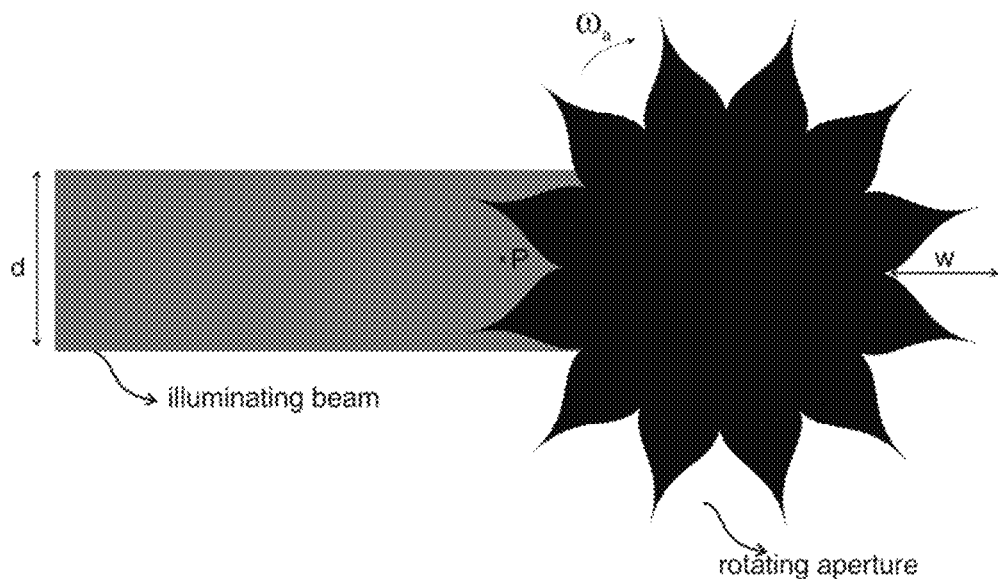
FIG. 15 illustrates a rotating aperture employed in a seventh embodiment.

FIG. 15 illustrates another example of an aperture that periodically displaces at each end of the elongated beam in a sixth embodiment. In this case, a shaped aperture is rotated near the end of the elongated to yield a desired intensity taper. Also in this case the shape of the aperture determines the taper profile. This can be easily calculated by again considering proportions of open and close times for a certain point in the illuminating beam. To obtain a sinusoidal profile again a shape similar to an arccos function may be used but this will be modified due to the circular motion. Therefore the diameter of the aperture also has a role in this case. This method may have the advantage that the aperture can be moved at fast speeds easily (facilitating an accurate time averaged profile) with rotary motors. Also in this case the frequency of rotation should preferably be adjusted or varied during exposure to avoid stroboscopic effects in the exposure if the illumination is pulsed.

Whereas the apodization filter 11 shown in FIG. 1 is located in the beam-path before the cylindrical optic 12 for introducing the range of angles of incidence in the plane orthogonal to the direction of beam elongation, in other embodiments of the invention the apodization filter, whatever its type (i.e. absorption, half-tone mask, moving aperture, etc), may be alternatively located in the beam path after the cylindrical optic 12, or before the lens 10 that collimates the light in the plane of beam elongation. The latter can be advantageous in the case of a very long elongated beam because it enables a filter on a much smaller substrate so facilitates fabrication.

Ideally the exact fall-off profile of the filter should take account of perturbation of the profile produced by propagation of the beam from the filter to the exposure plane, especially if the beam is subsequently passes through a lens which collimates the light in the plane of beam collimation. Such perturbations may be determined using standard optical design methods, such as using ray-trace S/W. The fall-off profile designed in the filter should therefore preferably also compensate for perturbation to the transmitted intensity distribution produced by the beam path and optics between the filter and the exposure plane.

Whereas in the above first embodiment only two sub-exposures are performed, in other embodiments three or more sub-exposures may be performed by repeating the procedures of the embodiment and using the same size of periodic pattern in the mask and an elongated beam of shorter length, or preferably by using masks with much larger periodic patterns so as to print larger uniform patterns onto substrates.

Whereas in the above first embodiment the laser emits light at a wavelength of 355 nm, in other embodiments the laser may be, for example, an excimer laser that emits light at a deep-UV wavelength of, for instance, 248 nm or 193 nm.

Whereas in the embodiments described above it is the mask and photoresist-coated substrate and mask that are scanned with respect to a static illumination beam during the sub-exposures and also stepped with respect to a static beam between the sub-exposures, in other embodiments of the invention the mechanical systems are designed and configured so that it is the illumination beam that is scanned with respect to a stationary mask and substrate during each sub-exposure and/or stepped with respect to a stationary mask and substrate between the sub-exposures. The illumination and translation stages in these embodiments are configured so that either the complete illumination system is scanned and/or stepped during and between the sub-exposures respectively, or just the optics (i.e. with a stationary laser) or a part of the optics, such as the apodization filter 11, cylindrical lens 12 and mirror 13 shown in FIG. 1 or other optics performing equivalent functions, are scanned and/or stepped during and between the sub-exposures respectively.

In other embodiments, the sub-exposures are performed simultaneously by two or more illumination systems each of which produces an elongated beam, from one or more laser sources, for scanning across the mask and substrate.

In other embodiments, the shape of the scanning beam is not elongated but its dimensions at the mask are the same or similar in the scanning and orthogonal directions. Such a beam may be generated, for example, by a similar configuration as shown in FIG. 1, from the same or other laser source, by using spherical optics and spherical microlens arrays to form a beam with a square cross-section, and using a cylindrical lens as in FIG. 1 to introduce the required range of angles of incidence in the xy plane at the mask. In yet other embodiments the beam size in the direction of the scan is larger than in the orthogonal direction. This may be achieved by additionally using a concave cylindrical lens to produce the range of angles required at the mask such that the cross-section of the beam is elongated from a square cross-section to one that is longer in the scanning direction.

Figure 16:
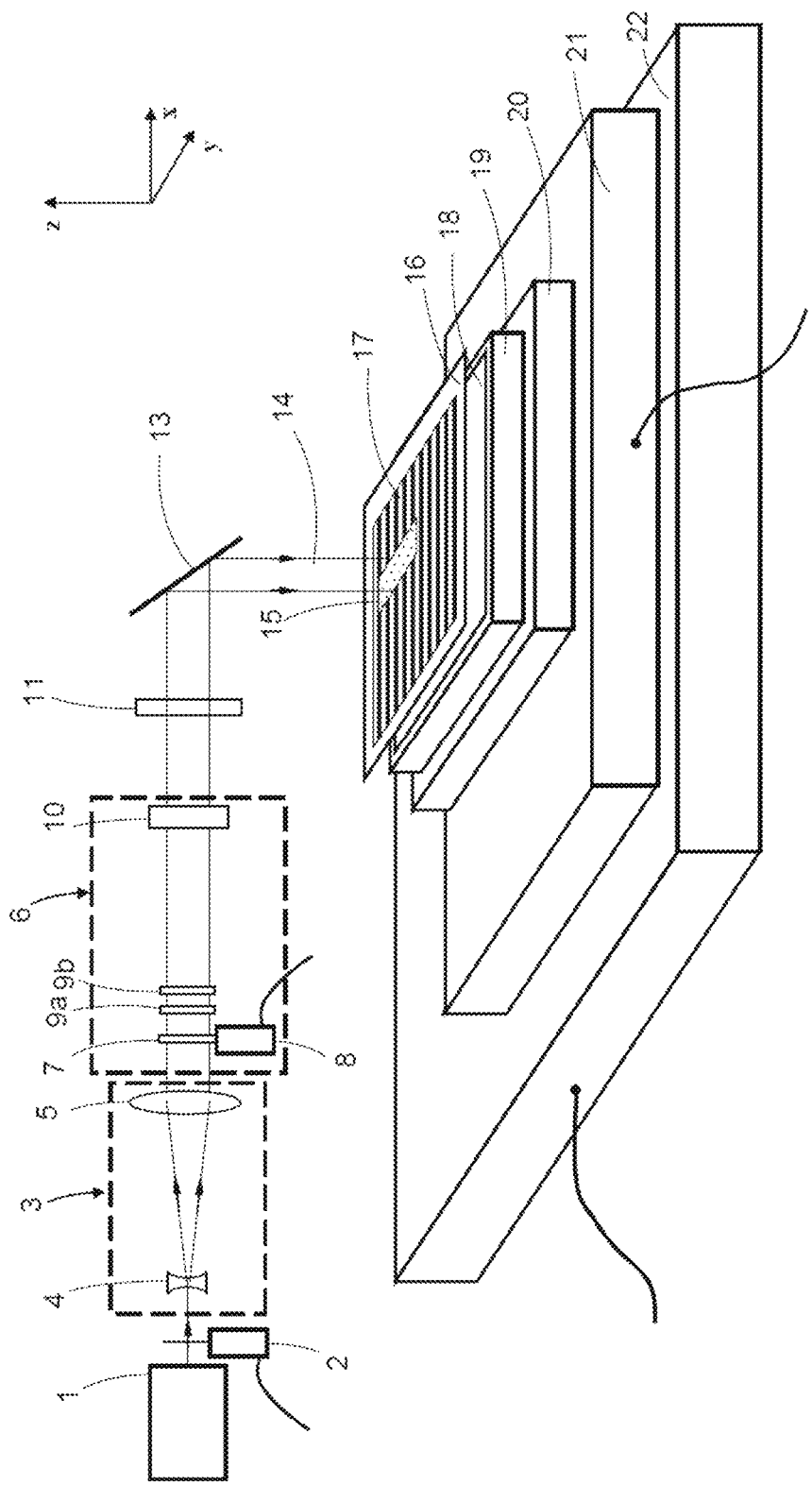
FIG. 16 illustrates a variant of the first embodiment in which the beam illuminating the mask is instead collimated in both planes, and the pattern is printed in each sub-exposure by varying the separation between mask and photosensitive layer according to displacement Talbot lithography, or by using a constant gap that is at least as large as the distance required for forming a stationary image according to achromatic Talbot lithography.

In other embodiments the structure on the mask may be a 1D grating or a two-dimensional periodic pattern and the scanning exposure is performed using DTL, ATL or another of the DTL-equivalent techniques of the prior art in which the beam illuminating the mask is instead collimated in both planes of incidence rather than possessing range of angles of incidence in one plane. A suitable exposure system for a DTL exposure is illustrated in FIG. 16. The system is the same as in FIG. 1 except that there is no cylindrical lens before the mirror 13 for introducing the range of angles in the xz plane so that mask is illuminated by an elongated beam having a uniform intensity along its length and, for example a linear fall-off of intensity at both ends, and a Gaussian intensity with a $1/e^2$ width of 10 mm in the orthogonal direction. Further, the mirror 13 is instead tilted such that the elongated beam illuminates the mask at normal incidence in both planes. Additionally, the positioning system of the mask includes piezo-electric actuators that enable a high-precision displacement of the mask 17 in the z direction during the exposure. Overlapping sub-exposures are performed using the same procedures of the previous embodiments and using any of the apodization filters (stationary or moving) employed in those previous embodiments, except that during each of the two sub-exposures the gap between the mask and photoresist-coated substrate is changed at a constant speed such that the change of gap resulting from the beam scanning a distance corresponding to the length of the mask pattern, $L_x$, given by:

$$\Delta gap = \frac{L_x L_T}{W_{FWHM}}$$

where $L_T$ is the Talbot distance of the periodic pattern being exposed and $W_{FWHM}$ is the full-width at half-maximum of the illumination beam (in the x direction).

If the pattern in the mask is a hexagonal array of holes with a nearest-neighbour distance of 0.6 μm and the illumination wavelength is 355 nm then the Talbot distance is calculated as ~1.5 μm. If $L_x$ is 200 mm and the $1/e^2$ full width of the beam is 10 mm (so $W_{FWHM} \approx 6$ mm), then Δgap 50 μm.

With this magnitude of gap change as the elongated beam scans across the pattern dimension $L_x$, the gap changes by at least 2× the Talbot distance as the beam scans across any particular part of the mask pattern, and so according to the teaching of U.S. Pat. No. 8,525,973 a periodic pattern is printed with high uniformity onto the substrates. With this embodiment any two-dimensional periodic pattern can be printed, with the speed of gap displacement required during each sub-exposure being determined in the same way as above.

DTL exposures may be performed with the apparatus of FIG. 16 using a different procedure. Rather than changing the gap slowly in the same direction as the elongated beam scans across the mask in each sub-exposure, the gap may be instead oscillated with sufficiently high frequency and with a suitable displacement amplitude and profile for each oscillation (in view of the teaching of U.S. Pat. No. 8,525, 973) such that the scanning beam prints a uniform pattern onto the substrate.

An ATL-type exposure may be alternatively carried using a similar exposure system as that illustrated in FIG. 16. A laser source with a sufficiently large spectral linewidth is employed that enables the stationary image to be formed at a reasonably small distance from the mask, which is desirable for printing a high-resolution pattern. For example, a laser diode operating at 405 nm wavelength may be employed whose linewidth is typically ~0.5 nm. The beam shaping and homogenizing optics should therefore be appropriately selected using standard optical design principles to produce an elongated beam with uniform intensity along its length and preferably a Gaussian intensity profile across it width. The beam is directed to the mask and photoresist-coated substrate so that it, as in FIG. 16, illuminates the mask at normal incidence. Any of the types of apodization filter described in the previous embodiments may be employed, though should be designed for use at 405 nm wavelength. In particular, the material and variation in thickness thereof employed for the absorption-type filter of the first embodiment should be suitable for this wavelength. The procedure may be substantially the same as employed in the first embodiment except that the separation between the mask and photoresist-coated substrate should be according to the teaching of U.S. Pat. No. 8,841,046. For example, if the pattern in the mask is a grating with period 600 nm, then the gap should be adjusted 1.44 mm so that the stationary image if formed at the photoresist. Two or more sub-exposures may be carried out with overlapping of the fall-off regions with linear or other profile in order to print a uniform pattern on the substrate including across the regions where the sub-exposures overlap.

In other embodiments each exposure is performed using a rectangular or square cross-section exposure beam of light that is collimated in both planes and is instead stationary on the mask during each sub-exposure. In these embodiments the apodization filter produces a defined complementary fall-off of the intensity distribution at all four edges of the beam, and the beam is stepped with respect to the mask and substrate in x and/or y directions between the different sub-exposures so that the patterns printed in the different sub-exposures overlap along both x-direction and y-direction edges to produce a composite pattern with high uniformity across the overlapping regions. Each sub-exposure may be performed using any of the DTL, ATL or equivalent methods with appropriate selection of the laser source and selection of the illumination optics based on the teaching in the earlier embodiments above.

In other embodiments an elongated illumination beam and an elongated mask are together scanned across the substrate to be printed according to the teaching of U.S. Pat. No. 9,182,672. In order to print a pattern with an area that is wider than the length of the mask two or more sub-exposures are performed with the mask and illumination beam being stepped in the direction of the mask and beam elongation between the successive sub-exposures, such that the regions at the end of the elongated beam with the controlled intensity fall-off overlap between successive sub-exposures to print a uniform composite pattern. The stepping of the mask between successive exposures is performed sufficiently accurately so that the lines and spaces of the superposed gratings printed in the overlapping regions are accurately aligned to form the desired uniform grating.

The invention claimed is:

1. A method of printing a desired uniform periodic pattern of linear features into a photosensitive layer on a substrate, the method comprising:

providing a mask bearing a mask pattern of linear features that are parallel to a first direction and have a period that is twice a period of the desired pattern;

arranging the substrate parallel to the mask and with a separation from the mask pattern;

generating an elongated beam of monochromatic light and directing the beam to the mask so that the light of the elongated beam illuminates the mask with a range of angles of incidence in a plane that is orthogonal to the direction of elongation and is parallel to the first direction, and so that the light of the elongated beam in a plane parallel to the direction of elongation is collimated and has a power per incremental distance along the length of the elongated beam that is uniform except at two ends of the elongated beam where the power per incremental distance falls to zero according to respectively a first profile over a fall-off distance and a second profile over the fall-off distance, wherein the range of angles is selected in relation to the wavelength of the light, the separation of the mask and substrate and the period of the mask pattern so that the light diffracted by the mask forms an intensity distribution at the substrate that is uniform in the direction orthogonal to a plane of the mask;

scanning the elongated beam in a first sub-exposure in a direction parallel to the first direction across a first part of the mask pattern so as to print a first part of the desired pattern on the substrate;

scanning the elongated beam in a second sub-exposure in a direction parallel to the first direction across a second part of said mask pattern that is offset from the first part of the mask pattern in the direction of the beam elongation, such that the first and second parts of the mask pattern overlap by the fall-off distance, and such that the angle of incidence of the beam in the plane parallel to the direction of elongation in the area of the mask pattern where the first and second parts overlap is the same in the first and second sub-exposures; and thereby selecting the first and second profiles so that a summation of the two profiles across the fall-off distance where the profiles are overlapped in the first and second sub-exposures produces a uniform power per incremental distance;

wherein the first and second profiles are both cosinusoidal.

2. The method according to claim 1, wherein the step of generating the elongated beam comprises interposing a variable-transmission apodization filter in an incident elongated beam with uniform power per incremental distance along a length of the incident elongated beam that is larger than that of the elongated beam, wherein the fall-off of power per incremental distance according to the first and second profiles at the two ends of the elongated beam transmitted by the apodization filter is produced by a variation of thickness of a partially absorbing layer on a transparent substrate.

3. The method according to claim 1, wherein the step of generating the elongated beam comprises interposing a half-tone mask apodization filter in an incident elongated beam having uniform power per incremental distance along a length of the incident elongated beam that is larger than that of the elongated beam, wherein the fall-off of power per incremental distance at each end of the elongated beam transmitted by the apodization filter is produced by a periodic series of apertures of the apodization filter whose period is substantially less than a width of the elongated beam so that a plurality of apertures intersect the width of the beam, and where a shape of the apertures is designed so that a mean transmission of the series of apertures at a particular distance across the fall-off region in the direction of beam elongation varies with the particular distance according to a selected first or second profile.

4. The method according to claim 1, wherein the step of generating the elongated beam includes interposing a $0^{th}$-order half-tone mask in an incident elongated beam having uniform power per incremental distance along a length of the incident elongated beam that is larger than that of the elongated beam, wherein the fall-off of power per incremental distance at each end of the elongated beam transmitted by the half-tone mask is produced by one or a plurality of linear gratings whose duty cycle and/or fill-factor varies across each grating and whose period is selected such that the $1^{st}$ and higher diffraction orders transmitted by the half-tone mask are diffracted at such large angles that they can be blocked before they illuminate the pattern of linear features.

5. The method according to claim 1, wherein the step of generating the elongated beam comprises interposing a half-tone mask apodization filter with a periodic series of apertures or a $0^{th}$-order half-tone mask having one or a plurality of linear gratings with a period for generating the fall-off of power per incremental distance at each end of the transmitted elongated beam, and displacing, during the first and second sub-exposures, the half-tone mask apodization filter or the $0^{th}$-order half-tone mask in the direction of the periodicity of the respective apertures or gratings.

6. The method according to claim 1, which comprises generating the fall-off of power per incremental distance at each end of the elongated beam by translationally oscillating an opaque aperture with a straight edge at each end of the elongated beam, wherein a profile of an oscillating motion of each aperture generates the respective first or second profile of the fall-off of power per incremental distance.

7. The method according to claim 1, which comprises generating the fall-off of power per incremental distance at each end of the elongated beam by rotating an aperture about an axis whose radius of the edge of the aperture from a rotation axis varies in a linear manner with increasing rotation angle except for an angle at which the radius reverts immediately back to an initial value or returns linearly back to the initial value.

8. The method according to claim 1, which further comprises generating a second elongated beam and directing the beam to the mask, and scanning instead the second elongated beam in the second sub-exposure simultaneously or sequentially to scanning the elongated beam in the first sub-exposure.

9. A method of printing a desired uniform periodic pattern of linear features or a two-dimensional periodic pattern into a photosensitive layer on a substrate, the method comprising:

providing a mask bearing a mask pattern of linear features that are parallel to a first direction and have a period that is twice a period of the desired pattern;

arranging the substrate parallel to the mask and with a separation from the mask pattern;

generating an elongated beam of collimated monochromatic light and directing the beam to the mask so that the light of the elongated beam illuminates the mask at normal incidence and has a power per incremental distance along the length of the elongated beam that is uniform except at two ends of the elongated beam where the power per incremental distance falls to zero according to respectively a first profile over a fall-off distance and a second profile over the fall-off distance;

scanning the elongated beam in a first sub-exposure in a direction parallel to the first direction across a first part of said mask pattern so as to print a first part of the desired grating on the substrate while changing the separation between the mask and the substrate;

scanning the elongated beam in a second sub-exposure in a direction parallel to the first direction across a second part of said mask pattern that is offset from the first part of the mask pattern in the direction of the beam elongation while changing the separation between the mask and the substrate, such that the first and second parts of the mask pattern overlap by the fall-off distance, and such that the angle of incidence of the beam in the plane parallel to the direction of elongation in an area of the mask pattern where the first and second parts overlap is the same in the first and second sub-exposures;

selecting the first and second profiles such that a summation of the first and second profiles across the fall-off distance where the profiles are overlapped in the first and second sub-exposures produces a uniform power per increment; and selecting a speed of changing the separation of the mask and the substrate in relation to a speed of scanning the elongated beam such that the pattern printed in each sub-exposure is formed using displacement Talbot lithography.

10. A method of printing a desired uniform pattern of linear features or a two-dimensional periodic pattern into a photosensitive layer on a substrate, the method comprising:

providing a mask bearing a mask pattern of linear features that are parallel to a first direction and have a period that is twice a period of the desired pattern;

arranging the substrate parallel to the mask and with a gap from the mask pattern;

generating an elongated beam of collimated light having a spectral bandwidth and directing the elongated beam to the mask so that the light of the elongated beam illuminates the mask at normal incidence and has a power per incremental distance along the length of the elongated beam that is uniform except at two ends of the elongated beam where the power per incremental distance falls to zero according to respectively a first profile over a fall-off distance and a second profile over the fall-off distance;

scanning said elongated beam in a first sub-exposure in a direction parallel to the first direction across a first part of said mask pattern so as to print a first part of the desired grating on the substrate while changing the separation between the mask and the substrate;

scanning the elongated beam in a second sub-exposure in a direction parallel to the first direction across a second part of said mask pattern that is offset from the first part of the mask pattern in the direction of the beam elongation while changing the separation between the mask and the substrate, such that the first and second parts of the mask pattern overlap by the fall-off distance, and such that an angle of incidence of the beam in the plane parallel to the direction of elongation in an area of the mask pattern where the first and second parts overlap is the same in the first and second sub-exposures; and selecting the first and second profiles so that a summation of the first and second profiles across the area of the mask pattern where the profiles are overlapped by the fall-off distance in the first and second sub-exposures produces a uniform power per incremental distance; and selecting the gap in relation to the spectral bandwidth of the illumination so that the pattern printed in each sub-exposure is formed using achromatic Talbot lithography.

11. A system for printing a desired periodic pattern of linear features into a photosensitive layer, the system comprising:

a mask bearing a mask pattern of linear features that are parallel to a first direction and have a period that is twice a period of the desired pattern;

a device for arranging the photosensitive layer parallel to the mask and with a separation from the mask pattern;

a beam generator for generating an elongated beam of light and directing the elongated beam to the mask so that the light of the elongated beam illuminates the mask with a range of angles of incidence in a plane orthogonal to a direction of elongation and parallel to the first direction and so that the light of the elongated beam, in a plane parallel to the direction of elongation, is well collimated and has uniform power per incremental distance along the length of the elongated beam except at two ends of the beam where the power per incremental distance falls to zero according to respectively a first profile over a fall-off distance and a second profile over the fall-off distance, wherein the range of angles is selected in relation to the wavelength of the light, the separation of the mask and substrate and the period of the mask grating so that the light diffracted by the mask forms an intensity distribution at the substrate that is uniform in the direction orthogonal to the plane of the mask;

a scanning device configured for scanning the elongated beam in a first sub-exposure in a direction parallel to the first direction across a first part of said mask pattern so as to print a first part of the desired grating on the substrate;

the scanning device also configured for scanning the elongated beam in a second sub-exposure in a direction parallel to the first direction across a second part of said mask pattern that is offset from the first part in a direction of a beam elongation, such that the first and second parts of the mask pattern overlap by the fall-off distance, and such that the angle of incidence of the beam, in a plane parallel to the direction of elongation, in an area of the mask pattern where the first and second parts overlap is the same as in the first sub-exposure, so as to print a second part of the desired grating that overlaps with the first part of the desired grating;

wherein the first and second profiles are selected so that a summation of the first and second profiles across the area of the mask pattern where the profiles are overlapped by the fall-off distance in the first and second sub-exposures produces a uniform power per incremental distance;

wherein said beam generator includes a component selected from the group consisting of: a variable-transmission apodization filter, a half-tone-mask apodization filter, and a $0^{th}$-order half-tone mask;

when the component is selected to be the variable-transmission apodization filter: the variable-transmission apodization filter is interposed in an incident elongated beam with uniform power per incremental distance along a length of the incident elongated beam that is longer than that of the elongated beam, and a fall-off of power per incremental distance according to the first and second profiles at the two ends of the elongated beam transmitted by the apodization filter is produced by a variation of thickness of a partially absorbing layer on a transparent substrate;

when the component is selected to be the half-tone-mask apodization filter: the half-tone-mask apodization filter is interposed in an incident elongated beam having uniform power per incremental distance along a length of the incident elongated beam that is longer than that of the elongated beam, the fall-off of power per incremental distance at each end of the elongated beam transmitted by the apodization filter is produced by a periodic series of apertures on the apodization filter whose period is substantially less than a width of the elongated beam so that a plurality of apertures intersect the beam, and a shape of the apertures is designed so that a mean transmission of a series of apertures at a particular distance across the fall-off region in the direction of beam elongation varies with a particular distance according to the selected first or second profile; and when the component is selected to be the $0^{th}$-order half-tone mask: the $0^{th}$-order half-tone mask is interposed in an incident elongated beam having uniform power per incremental distance along a length of the incident elongated beam that is longer than that of the elongated beam, and the fall-off of power per incremental distance at each end of the elongated beam transmitted by the half-tone mask is produced by an array of gratings with a duty cycle and/or fill-factor that varies along each grating and having a period that is selected such that $1^{st}$ and higher diffraction orders transmitted by the half-tone mask are diffracted at such large angles that they can be blocked before they illuminate the pattern of linear features.

12. The system according to claim 11, wherein the component is selected to be the variable-transmission apodization filter.

13. The system according to claim 11, wherein the component is selected to be the half-tone-mask apodization filter.

14. The system according to claim 11, wherein the component is selected to be the $0^{th}$-order half-tone mask.

* * * * *